United States Patent [19]

Miner et al.

[11] Patent Number: 4,980,658
[45] Date of Patent: Dec. 25, 1990

[54] GIGAHERTZ BANDPASS PASSIVE INTEGRATOR

[75] Inventors: Lynn M. Miner, Albo; Donald E. Voss, Cedar Crest, both of N. Mex.

[73] Assignee: The United States of America as represented by the Secretary of the Air Force, Washington, D.C.

[21] Appl. No.: 403,210

[22] Filed: Sep. 1, 1989

[51] Int. Cl.$^5$ .............................................. H03H 7/00
[52] U.S. Cl. ..................................... 333/19; 333/245
[58] Field of Search .................... 333/19, 20, 172, 245; 361/305, 311

[56] References Cited

U.S. PATENT DOCUMENTS 3,335,345  8/1967  Diefendorf ...................... 361/305 X

*Primary Examiner*—Paul Gensler
*Attorney, Agent, or Firm*—William G. Auton; Donald J. Singer

[57] ABSTRACT

A passive cylindrical integrator assembly is disclosed which provides an output voltage into 50 ohm load that is proportional to the time integral of the input voltage. The device has a bandpass of greater than 1000 MHz plus and a risetime which is less than 350 picoseconds. The device produces negligible overshoot for very fast rising and falling signals. The construction of the device uses low cost materials and is configured into a cylindrical shape. The cylindrical housing concentrically supports front and rear connectors or center pins. Each center pin is connected to a 470 ohm ¼ watt resistor. The resistors are in turn held in place by a screw and nut in contact with the graphite material which fills the center of the cylinder. A dielectric film surrounds the graphite material insulating it from the outer housing wall.

3 Claims, 5 Drawing Sheets

SECTION A-A

SECTION B-B

GIGAHERTZ BANDPASS PASSIVE INTEGRATOR

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to electronic integrator circuits, and more specifically to a passive, i.e. unpowered, cylindrical integrator assembly.

Electronic integrator circuits are devices which produce an electronic output signal which is proportional to the time integral of the input signals that they receive. Such devices have applications in various basic and applied research fields, including pulsed-power microwave and laser source development, accelerator and plasma physics, electron beam propagation, inertial confinement and magnetic fusion, testing of advanced related nuclear weapons development, and other activities. In such applications, the integrator circuit approximates the mathematical process of integration of the input voltage.

It is often desired to integrate a signal from a previous time, (t-T), to the present time, t, in order to compensate for the time differentiation introduced by certain classes of sensors, including electric and magnetic field sensors. This previously has been done by using integrators which are only poor approximations particularly at GHz frequencies, to the actual desired mathematical integral. An integrator circuit generally consists of the charging of a capacitor through a series resistor, with the integrator output measured as the instantaneous voltage across the capacitor.

The prior art integrators, as described above, are often limited by their output risetimes, and some require external sources of power. The task of providing a passive integrator assembly with improved output voltage risetime characteristics is alleviated, to some extent, by the systems disclosed in the following U.S. Patents, the disclosures of which are incorporated herein by reference:

U.S. Pat. No. 3,500,257 issued to Mensa;
U.S. Pat. No. 4,229,700 issued to Greene; and
U.S. Pat. No. 4,586,008 issued to Raleigh.

The patent to Mensa teaches a passive RC integrator circuit which provides a linear output by adding a potentiometer in cascade across the RC input circuit. The patent to Green teaches a pulse width pulser having a 10 picosecond rise and fall time which employs a reed switch between a center conductor and the output line. The patent to Raleigh teaches a fast passive integrator device (250 picoseconds) which is in essence a low impedance coaxial transmission line.

While the references cited above represent definite advances in the art, the need for new integrator systems with improved risetimes represents an ongoing need particularly with a wide variety of measuring devices, or "diagnostics", utilized in many research fields. While some diagnostics produce an output voltage directly proportional to the quantity of interest, other diagnostics produce an electrical signal which is differentiating, or in other words, the output voltage is proportional to the time derivative of the quantity which is actually sought. This is particularly true Of the magnetic and electric field sensors commonly used in various basic and applied research fields, including pulsed power, microwave, and laser source development, accelerator and plasma physics, electron beam propagation, inertial confinement and magnetic fusion, plasma physics, electron beam propagation, inertial confinement and magnetic fusion, and testing of advanced concepts related to nuclear weapons development Instrumentation has an upper bound to its frequency bandpass The inherent characteristic of differentiating sensors to emphasize higher harmonic content implies that no matter what type of recording instrumentation is utilized, there will always be more high frequency distortion introduced by the recording system when it stores a differential signal relative to when it stores an undifferentiated, i.e., integrated, signal. Thus, the use of passive integrators with improved risetimes represents an ongoing need. The present invention is directed towards satisfying that need.

SUMMARY OF THE INVENTION

The present invention is a passive cylindrical integrator assembly which provides an output voltage into a 50 ohm load that is proportional to the time integral of the input voltage. The device has a bandpass exceeding 1000 MHz plus a risetime which is less than 350 picoseconds. The device produces negligible overshoot for very fast rising and falling signals. The construction of the device uses low cost materials and is configured into a cylindrical shape.

One embodiment of the invention is a passive cylindrical integrator assembly composed of: a brass cylindrical housing, a graphite cylindrical capacitor bobbin, a dielectric film covering, two resistors, and two center pin connectors. The cylindrical housing concentrically supports front and rear connectors or center pins. Each center pin is connected to a 470 ohm ¼ watt resistor. The resistors are in turn held in place by a screw and nut in contact with the graphite material which fills the center of the cylinder. A dielectric film surrounds the graphite material insulating it from the outer housing wall. The graphite cylindrical capacitor is housed within the cylindrical housing and is electrically connected in a series circuit on either end with the resistor and the front and rear center pins. The center pins provide the input and output electrical connection for use of the integrator while the electrical characteristics of the resistors and capacitor establish the time period of the response time of the integrator.

It is an object of the present invention to provide a passive cylindrical integrator assembly with improved output voltage risetime characteristics.

It is another object of the present invention to provide an integrator circuit with a frequency bandpass which exceeds 1,000 MHz.

It is another object of the present invention to provide an integrator which minimizes ringing and overshoot in its output These objects together with other objects, features and advantages of the invention will become more readily apparent from the following detailed description when taken in conjunction with the accompanying drawing wherein like elements are given like reference numerals throughout

DETAILED DESCRIPTION OF THE PREFERRED EMBODIMENT

The present invention is a cylindrical passive integrator circuit, which integrates an input analog signal with subnanosecond risetime output voltages.

Figure 1:
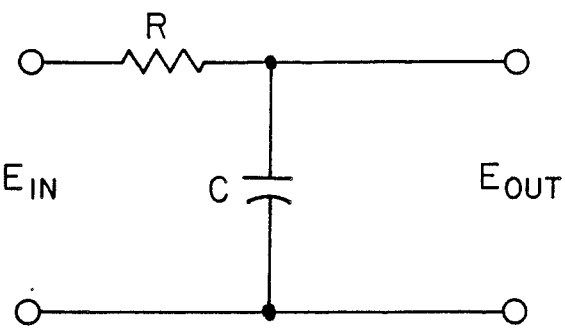
FIGS. 1 and 2 are electrical schematics of prior art integrator circuits.
Figure 2:
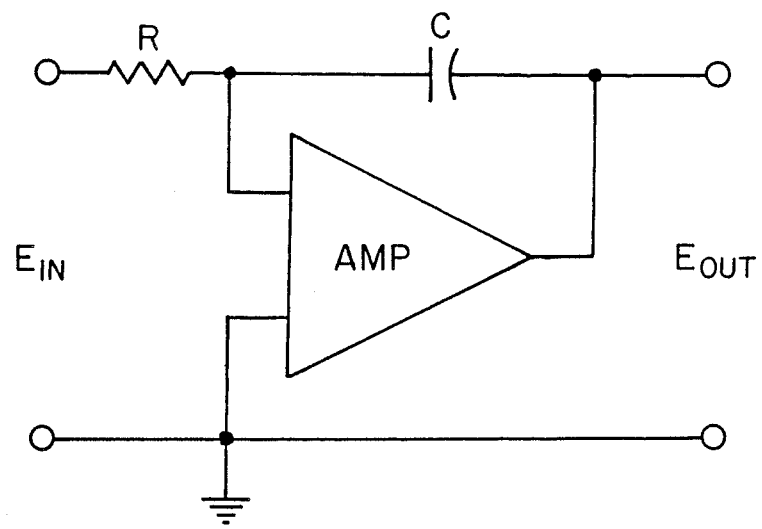

The reader's attention is now directed towards FIGS. 1 and 2, which are electrical schematics of prior art integrator circuits. Both systems produce an output which is proportional time to the integral of the input E over the interval of T, as given below in Equation 1:

$$E_{out} = \frac{1}{T} \int_0^t dt'\, E_{in}(t')$$

for $T = RC$; where
$R$ is in ohms and $C$ is in farads

The system of FIG. 1 integrates without amplifying the input, while the system of FIG. 2 provides amplification. Both systems of FIGS. 1 and 2 have limited bandpass and risetime due to effects introduced by parasitic inductance and capacitance, which cannot be eliminated. The purpose of the present invention is to provide a system which produces an output voltage which is accurately proportional to the integrated value of the input with subnanosecond risetime output voltages.

As mentioned above, both the system of FIGS. 1 and 2 have limits on their bandpass and risetime characteristics which are introduced by parasitic inductance and capacitance. Inductance is defined as "the establishment of a second electric charge and a second magnetic field in a conductor by the variation of a first magnetic charge or first magnetic field". In FIG. 1, the alternating electrical current through the resistor R causes a first magnetic field to radiate around the resistor and its electrodes. This first magnetic field intersects the capacitor because of its propinquity and position with respect to the resistor. The resulting deterioration on the bandpass and risetime of the integrator of FIG. 1 is an indirect problem that is the result of the position and propinquity of the capacitor and resistor. However, when the resistor is axially aligned with a cylindrical capacitor, the first induced magnetic field is inherently unable to assert the same amount of parasitic inductance between the elements, since both elements are at the center of the annular ring of induced magnetic field. While some level of parasitic inductance and capacitance between the elements will remain, the axial alignment of the cylindrical resistor with the cylindrical capacitor reduces the parasitic capacitance and inductance between the elements, and produces measurable improvements in risetime and bandpass characteristics as described below.

Figure 3:
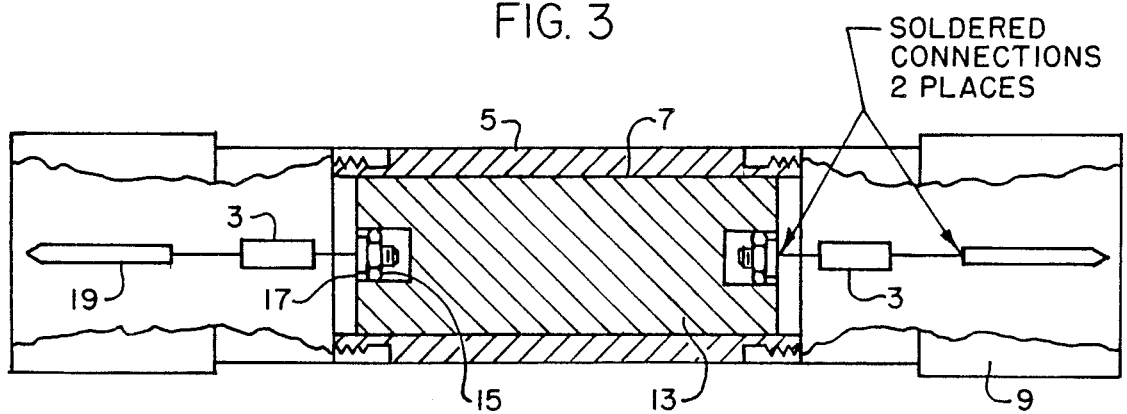
FIGS. 3 through 9 are illustrations of embodiments of elements of the present invention.

The reader's attention is now directed towards FIGS. 3–9 which are illustrations of embodiments of the present invention. The system of FIG. 3 is a passive cylindrical integrator assembly composed of: a brass cylindrical housing 5, a graphite cylindrical capacitor bobbin 13, a dielectric film covering 7, two resistors 3, and two center pin connectors 19. The cylindrical housing 5 concentrically supports front and rear connectors or center pins 19. Each center pin is connected to a 470 ohm ¼ watt resistor 3. The resistors are in turn held in place by a screw 17 and nut 15 in contact with the graphite material 13 which fills the center of the cylinder. A dielectric film 7 surrounds the graphite material, insulating the graphite material from the outer housing wall. The graphite cylindrical capacitor 13 is housed within the cylindrical housing 5, and is electrically connected in a series circuit on either end with the resistor 3 and the front and rear center pins 19. The center pins 19 provide the input and output electrical connection for use of the integrator while the electrical characteristics of the resistors and capacitor establish the time period of the response time of the integrator. For a time constant of about 500 picofarads, the capacitor of FIG. 3 would have a value of about 0.5 picofarads, but the values of C and R of the capacitor and resistors can be varied in accordance with the different time constants required.

Note that each and every element of the assembly of FIG. 3 is either commercially available, or easily fabricated. The parts list for the assembly of FIG. 3 is given below in Table 1.

TABLE 1

Parts List
GIGAHERTZ BANDPASS PASSIVE
INTEGRATOR ASSEMBLY

| Quantity | Item | Part Number | Identifier No. |
|---|---|---|---|
| 2 | TYPE N CONNECTOR, CENTER PIN | AMP #74868UG-21B/U | 19 |
| 2 | 0-80 SCREW, MODIFY | STAINLESS STEEL | 17 |
| 2 | 0-80 NUT | STAINLESS STEEL | 15 |
| 1 | CAPACITOR BOBBIN | AXF-5Q POCO GRAPHITE | 13 |
| 2 | TYPE N CONNECTOR, OUTER HOUSING | AMP 37488UG-21B/7 | 09 |
| 1 | DIELECTRIC | .0003 KAPTON | 07 |
| 1 | HOUSING | BRASS | 05 |
| 2 | RESISTOR | 470 OHM .25 WATT | 03 |

Figure 4:
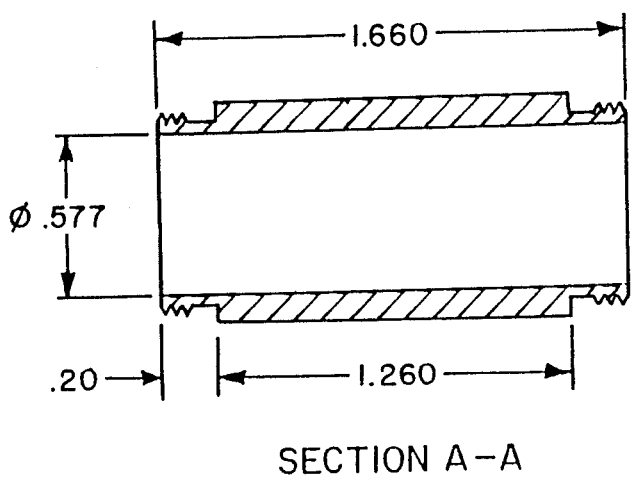
Figure 5:
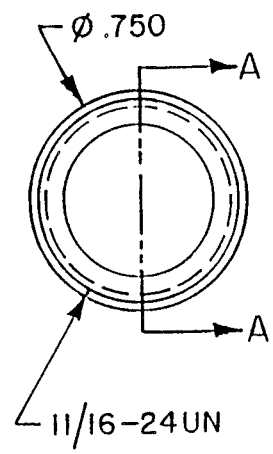
Figure 6:
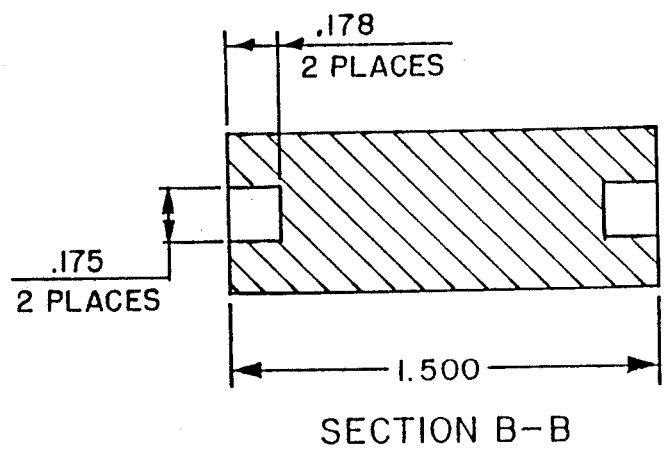
Figure 7:
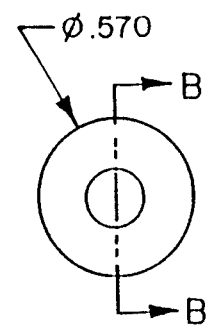
Figure 8:
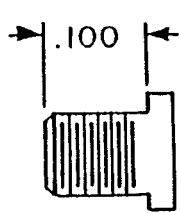
Figure 9:
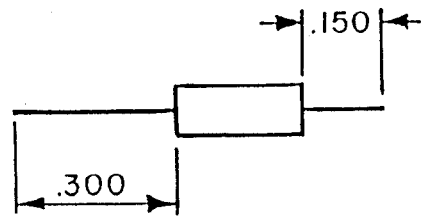

To ensure that the housing 5, capacitor bobbin 13 and other elements are completely understood, FIGS. 4–9 are views of these components with their dimensions depicted in inches FIGS. 4 and 5 respectively depict side and end views of the brass housing 5 of the assembly of FIG. 3. FIGS. 6 and 7 respectively depict side and end views of the capacitor bobbin 13 of the assembly of FIG. 3. FIG. 8 is a side view of the screw 17 used in FIG. 3, and FIG. 9 is a side view of one of the two resistors 3 of FIG. 3.

As shown in FIG. 3, the #15 0-80 nuts are inserted into the capacitor bobbin and are epoxied in place with TRA-CON, TRA-DUCT BA-2902 Silver Bearing Conductive Epoxy or equivalent (0.03 ohm/cm, Volume Resistivity) The Kapton is wrapped tightly around the capacitor bobbin to form a good smooth surface. By varying the thickness of the Kapton and changing the resistor values it is possible to produce integrators with a wide range of time constant values from just a few nanoseconds to microseconds.

The system of FIG. 3 is an integrator which yields an output voltage into a 50 ohm load which is proportional to the time integral of the input voltage. The device requires no external power and is therefore passive in nature. The integrator described here simultaneously achieves a wider bandpass (exceeding 1000 MHz) and faster risetime (less than 350 picoseconds) than found in any other electronic integrator systems.

FIGS. 10-14 are charts depicting oscilloscope measurements of various test results of the system of FIG. 3. Tests were conducted on the invention and the results of the tests clearly show the operating characteristics of these integrators.

Figure 10:
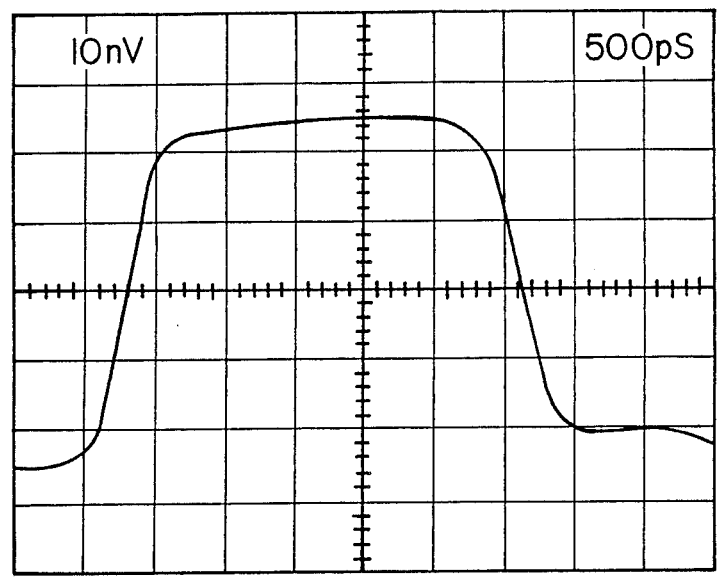
FIGS. 10-14 are charts of test results of the present invention.
Figure 11:
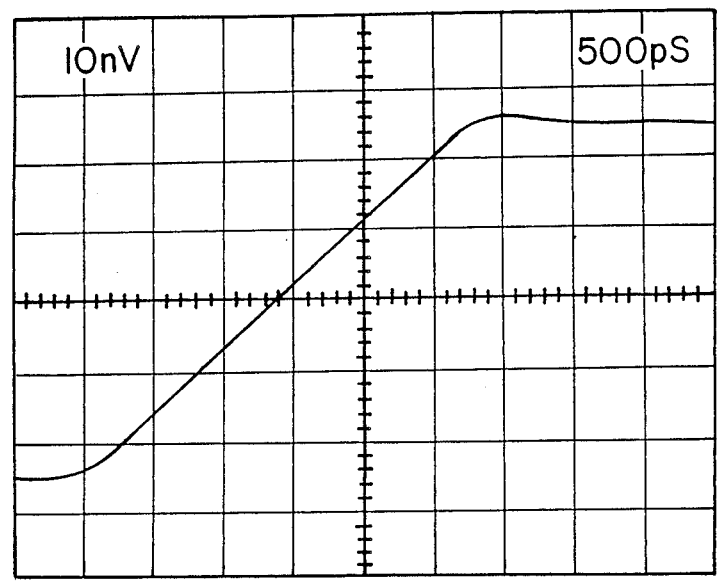

FIG. 10 is a chart depicting the oscilloscope measurement of the signal at the input to the integrator under test. This signal is produced by a Tektronix 109 pulser. FIG. 11 is a chart which shows the output of the integrator for the square wave input of FIG. 10. Note the smooth response and lack of overshoot.

Figure 12:
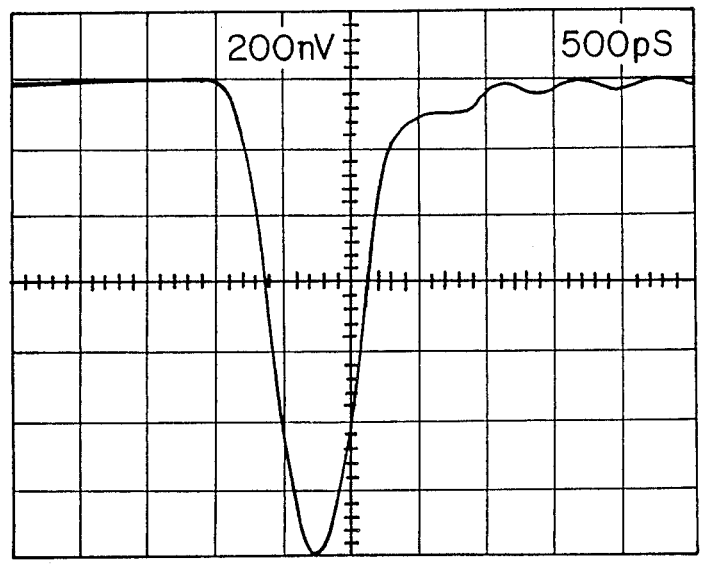
Figure 13:
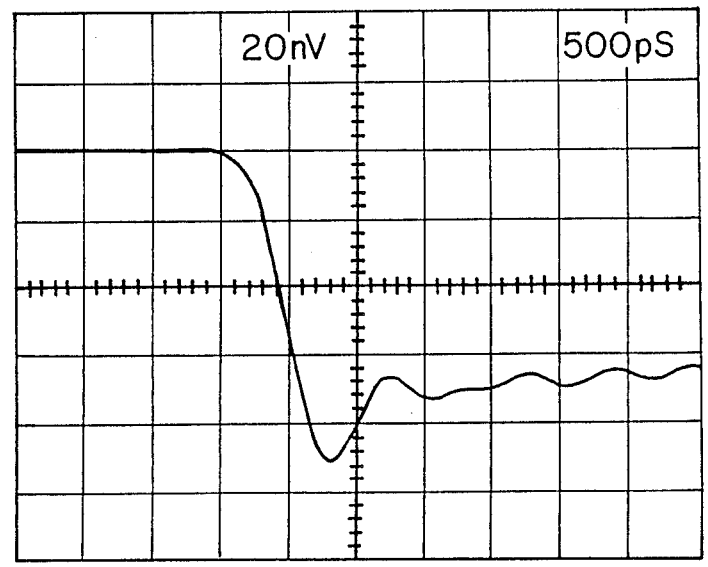

FIG. 12 is a chart which shows the input to the integrator under test from a delta function generator with a risetime of 250 ps. As described in the previous discussion of the data shown in FIG. 10, the apparent risetime in the signal, 430 psec, is limited by the oscilloscope response FIG. 13 is a chart which shows the output of the Physics International (San Leandro, Calif.) integrator given the delta function input of FIG. 13. Note the overshoot (25 percent) and ringing inherent in this commercial device. This overshoot and ringing is believed to be characteristic in most state-of-the-art integrator systems.

Figure 14:
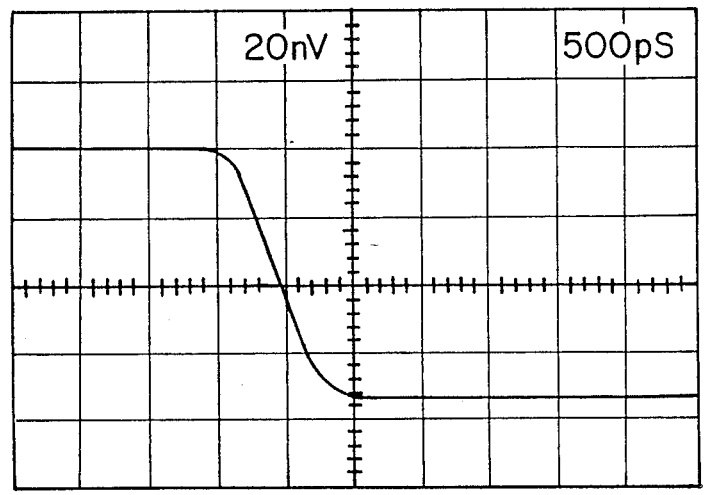

FIG. 14 is a chart which shows the output of the integrator of FIG. 3 given the delta function input Note the smooth response and lack of overshoot and ringing The risetime shown here, 550 psec, is consistent with a convolution of the 250 psec pulser risetime, 350 psec scope risetime, and the 350 psec integrator risetime.

The operation of the integrator is unique in that the output voltage generated is an accurate time integral of the input voltage even though the input voltage may be rising and/or falling on time scales as fast as 250 picoseconds. The integrator operation is also unique because it can drive a 50 ohm load while maintaining a time constant exceeding 300 nanoseconds. The ability to drive a 50 ohm load is an absolute necessity if the rapidly fluctuating output voltage is to be recorded by state-of-the-art, GHz bandpass oscilloscopes such as the Tektronix model 7104 mainframe-7A29 preamplifier combination, or similar recording devices, which have intrinsic input impedances of 50 ohms.

The test data suggests that the system of FIG. 3 is characterized by the properties listed below in Table 2.

TABLE 2

| | |
|---|---|
| (1) | Output risetimes faster than 350 picoseconds; |
| (2) | Frequency bandpasses exceeding 1000 MHz; |
| (3) | Negligibly small, less than 1 percent, overshoot for a 250 picosecond risetime delta function source; |
| (4) | Ability to drive a 50 ohm (or higher) impedance signal into the output connector; and |
| (5) | Time constant exceeding 300 nanoseconds under conditions 1-4 above. |

Both the construction and operation of the device are unique. The construction technique itself is fundamentally simpler than that of previous state-of-the-art systems, allowing a critical operating parameter of the device, the electrical time constant, to be easily changed. This integrator construction involves use of low cost, readily available materials which are assembled inside of a cylindrical shell which acts as both an electromagnetic shield as well as a compact supporting fixture.

The construction technique of the present invention facilitates easy repair of the device, if required However, the operational characteristics of the invention are equally important, since the majority of electric and magnetic field sensors used in research produce outputs proportional to the time derivative of the electrical or magnetic input of course, it is the time history of the electrical or magnetic field itself, and not its time derivative, which is typically of interest to the research scientist. Mathematically, it is necessary to integrate the electrical signal produced by a differentiating sensor in order to invert the differentiating process and thereby reproduce the time history of the quantity under diagnosis. The passive integrator described here carries out that integration process electronically, allowing the oscilloscope or other form of recording instrumentation to record the diagnostic signal which is actually of interest, rather than its time derivative.

Note that although it is much more tedious and inconvenient, it is possible to integrate a differential signal after it has been recorded using digital integration techniques. However, for the highest bandpass applications, when bandpasses of a few hundred to a thousand megahertz are required, the substantial signal distortion introduced by the recording medium, typically an oscilloscope, makes this approach technically inferior to electronically integrating the signal prior to recording. This occurs because a differentiating sensor produces an output spectrum which preferentially enhances high frequency components relative to low frequency components. This can be seen by simply differentiating the Fourier representation of an arbitrary time dependent voltage signal V(t). A signal V(t) can be represented by a sum of sinusoidally varying terms as follows:

$$V(T) = \sum_{n=0}^{\infty} [A_n * \sin(2 *\pi* f * n * t) + B_n * \cos(2 *\pi* f * n * t)] \quad (1)$$

where f is a frequency such that the associated waveform period includes the time of interest, t is the time variable, and $A_n$ and $B_n$ are the Fourier coefficients chosen to match the waveform of interest in the usual way (see, for example, Marcel Alonso and Edward J. Finn, *Fundamental University Physics*, Addison-Wesley Publishing Company, Reading, Mass., 1967, page 382). The time derivative of the V(t) signal follows in this representation as $$dV(t)/dt = \sum_{n=0}^{\infty} [2 *\pi* f * n * A_n * \sin(2 *\pi* f * n * t) + 2 *\pi* f * n * B_n * \cos(2 *\pi* f * n * t)] \quad (2)$$

through differentiation with respect to the variable t in the usual manner. Note that because the factor n occurs because of the differentiation process, the higher harmonics are emphasized in a differential type sensor. Because all recording instrumentation has an upper bound to its frequency bandpass the inherent characteristic of differentiating sensors to emphasize higher harmonic content implies that no matter what type of recording instrumentation is utilized, there will always be more high frequency distortion introduced by the recording system when it stores a differentiated signal relative to when it stores an undifferentiated, i.e. integrated, signal. Thus, use of passive integrators, such as the type described here, is always technically superior to the technique of recording a signal and performing a digital integration after the fact, for applications in which low distortion of high frequency components is desired. For example, in our laboratory tests involving electric and magnetic field differentiating sensors which produce subnanosecond risetime output voltages, fast passive integrators of the type described here are utilized prior to recording on 1 GHz bandpass oscilloscopes This invention can be used for integration of fast rising (faster than 1 nanosecond risetime) signals, prior to recording, produced by differentiating electric and magnetic sensors utilized in laboratory programs for testing vulnerability and lethality of various Air Force weapon systems to forms of electromagnetic radiation. However, as discussed above, these integrators are useful for pre-recording integration of the electric signals produced in a variety of diagnostic sensors supporting basic and applied research fields.

While the invention has been described in its presently preferred embodiment it is understood that the words which have been used are words of description rather than words of limitation and that changes within the purview of the appended claims may be made without departing from the scope and spirit of the invention in its broader aspects. For example, the passive integrator assembly of FIG. 3 has been described as a cylindrical assembly composed of a cylindrical brass housing which encompasses a cylindrical graphite capacitor bobbin In practice, the inventor should not be considered to be limited to cylindrical geometric shapes, brass conductors, or graphite capacitors. The system of FIG. 3 is the preferred embodiment, but other geometric shapes and materials may be used as long as the electronic components are selected within the guidelines provided above.

What is claimed is:

1. A passive cylindrical integrator assembly comprising:
   a cylindrical brass housing;
   a graphite cylindrical capacitor which is fixed in said cylindrical brass housing, and which has an input side and an output side;
   a dielectric film coating which circumscribes said graphite cylindrical capacitor, and which fits between said cylindrical brass housing and said graphite cylindrical capacitor;
   an input resistor which is fixed to said input side of said graphite cylindrical capacitor to conduct an input voltage signal thereto, said input resistor being axially aligned with said graphite cylindrical capacitor to minimize parasitic inductance and capacitance therebetween;
   an output resistor which is fixed to said output side of said graphite cylindrical capacitor to conduct an output signal therefrom, said output signal being proportional to an integral of said input voltage signal, said output resistor being axially aligned with said graphite cylindrical capacitor to minimize parasitic inductance and capacitance therebetween; and
   a means for fixing said input and output resistors respectively to said input and output sides of said graphite cylindrical capacitor.

2. A passive integrator assembly, as defined in claim 1, wherein said input and output resistors respectively have an input and output impedance, and said capacitor has capacitance, said capacitance and said input and output impedance electrically interacting to produce a time constant for said passive integrator so that said output signal has a voltage risetime of less than 350 picoseconds.

3. A passive integrator assembly, as defined in claim 3, wherein said fixing means comprises:
   an input and output nut which are respectively fixed to said input and output sides of said capacitor; and
   an input and output screw which respectively attach terminals of said input and output resistors to said input and output nuts.

* * * * *